US009635765B2

(12) United States Patent
Ishihara et al.

(10) Patent No.: US 9,635,765 B2
(45) Date of Patent: Apr. 25, 2017

(54) COMBINED WIRING BOARD AND METHOD FOR MANUFACTURING COMBINED WIRING BOARD

(71) Applicant: IBIDEN CO., LTD., Ogaki-shi (JP)

(72) Inventors: Teruyuki Ishihara, Ogaki (JP); Michimasa Takahashi, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 331 days.

(21) Appl. No.: 14/465,127

(22) Filed: Aug. 21, 2014

(65) Prior Publication Data

US 2015/0055313 A1    Feb. 26, 2015

(30) Foreign Application Priority Data

Aug. 21, 2013  (JP) ................................ 2013-171017

(51) Int. Cl.
*H05K 3/00* (2006.01)
*H05K 3/34* (2006.01)

(52) U.S. Cl.
CPC ......... *H05K 3/0097* (2013.01); *H05K 3/0032* (2013.01); *H05K 3/0052* (2013.01); *H05K 3/3494* (2013.01); *H05K 2201/0909* (2013.01); *H05K 2201/10424* (2013.01); *Y10T 29/49126* (2015.01)

(58) Field of Classification Search
CPC .. H05K 3/0097; H05K 3/0032; H05K 3/0052; H05K 3/3494; H05K 2201/0909; H05K 2201/10424; H05K 1/142; H05K 3/36; Y10T 29/49126
See application file for complete search history.

(56) References Cited

U.S. PATENT DOCUMENTS

2014/0131074 A1   5/2014  Ishihara et al.
2014/0133110 A1   5/2014  Takahashi et al.
2014/0133111 A1   5/2014  Ishihara et al.

FOREIGN PATENT DOCUMENTS

JP         2011-023657 A        2/2011

*Primary Examiner* — Steven T Sawyer
*Assistant Examiner* — Ahmad D Barnes
(74) *Attorney, Agent, or Firm* — Oblon, McClelland, Maier & Neustadt, L.L.P.

(57) ABSTRACT

A method for manufacturing a combined wiring board includes preparing wiring boards, preparing a metal frame having opening portions formed to accommodate the wiring boards, respectively, positioning the wiring boards in the opening portions in the metal frame, and forming crimped portions in the metal frame by plastic deformation such that sidewalls of the metal frame in the opening portions bond sidewalls of each of the wiring boards. The crimped portions are formed such that the crimped portions in the metal frame have amounts of the plastic deformation which are set different for positions of the crimped portions in the metal frame.

16 Claims, 12 Drawing Sheets

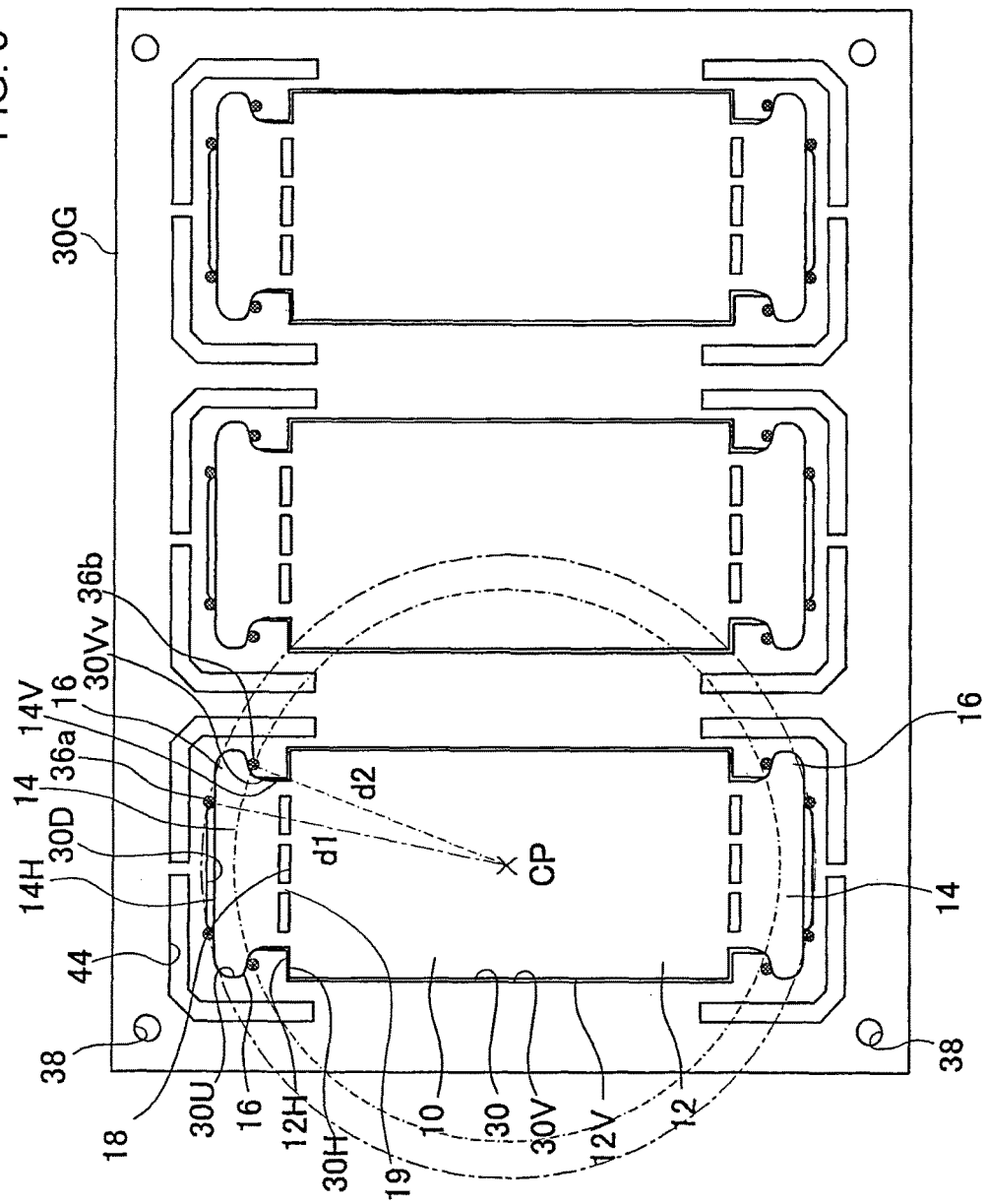

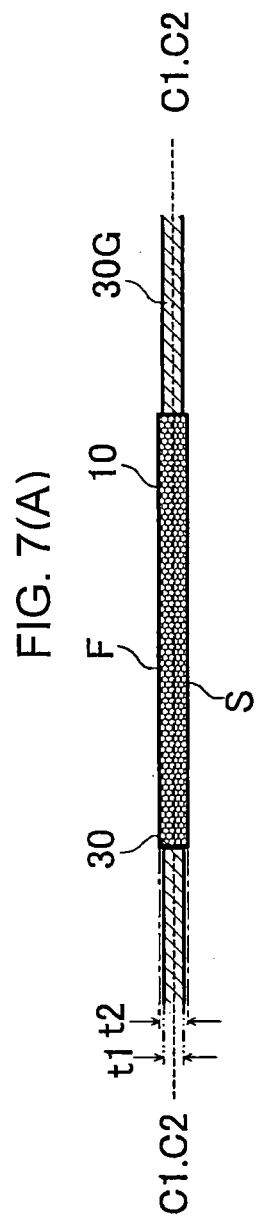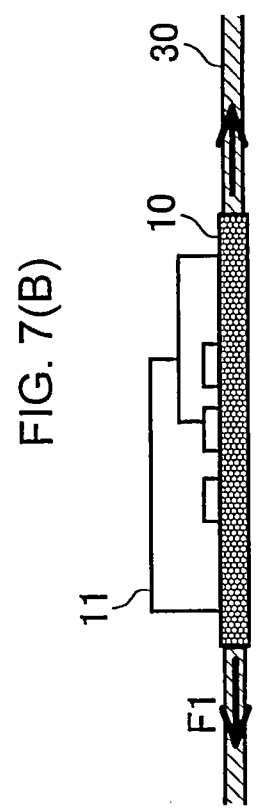

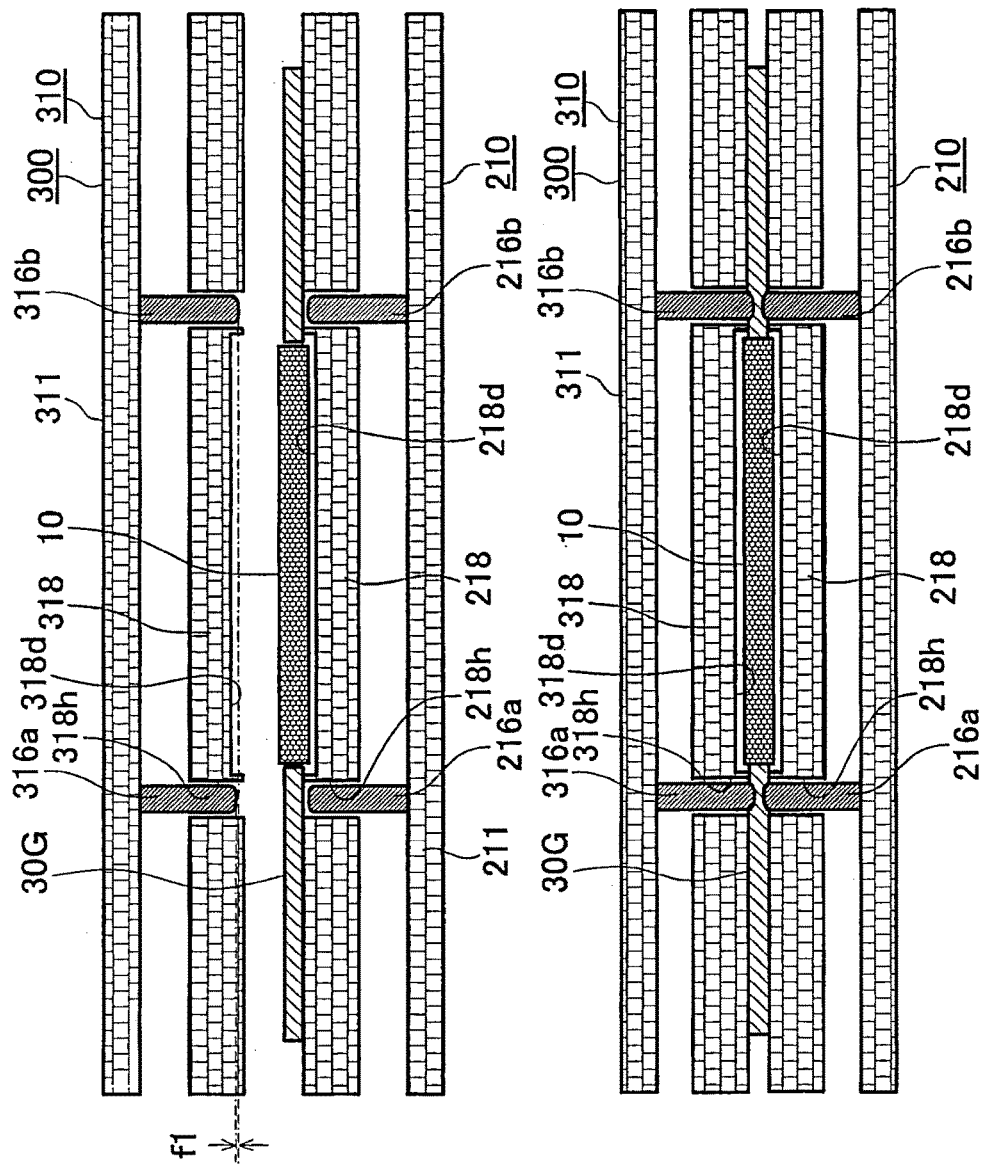

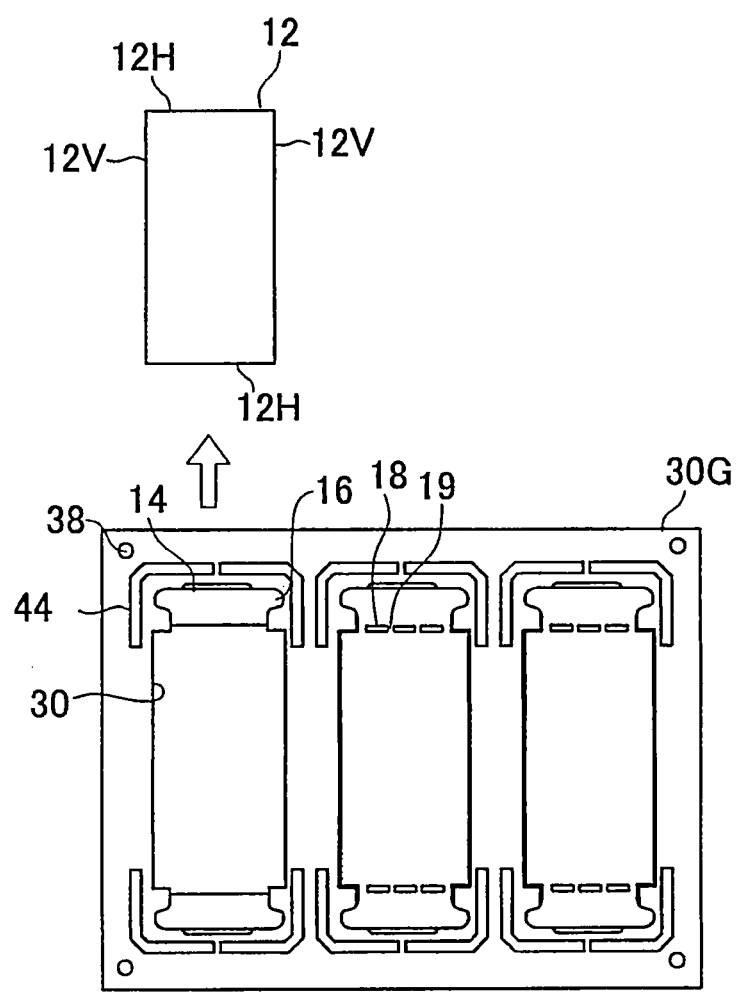

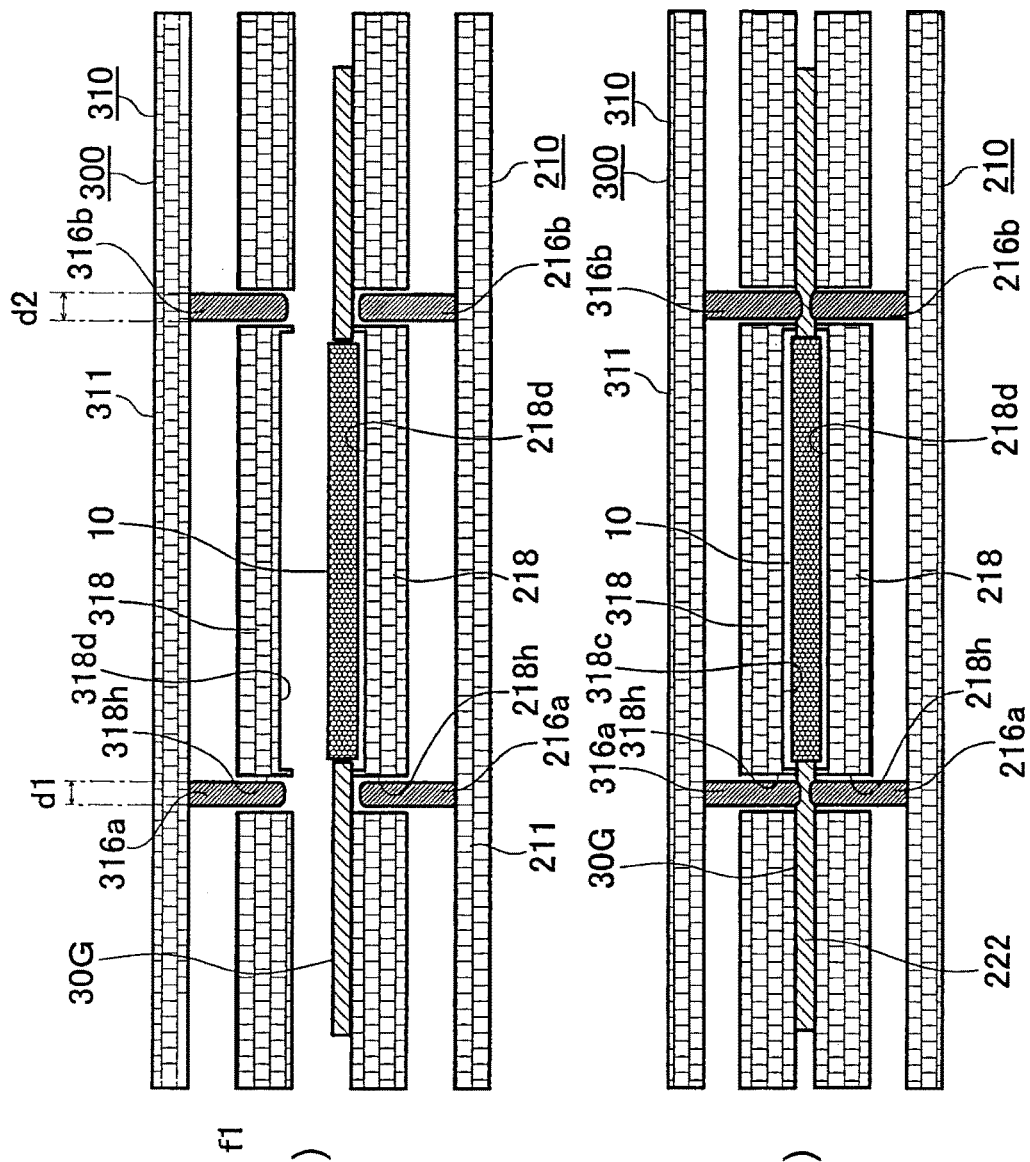

COMBINED WIRING BOARD AND METHOD FOR MANUFACTURING COMBINED WIRING BOARD

CROSS-REFERENCE TO RELATED APPLICATIONS

The present application is based upon and claims the benefit of priority to Japanese Patent Application No. 2013-171017, filed Aug. 21, 2013, the entire contents of which are incorporated herein by reference.

BACKGROUND OF THE INVENTION

Field of the Invention

The present invention relates to a combined wiring board where wiring boards to be reflowed are fixed to a frame, and to a method for manufacturing such a combined wiring board.

Description of Background Art

When mounting an electronic component on a wiring board and conducting other processes on the wiring board, such procedures may be performed not on one single wiring board but by accommodating multiple identical wiring boards in an accommodation kit. JP2011-23657A describes a multipiece wiring board accommodation kit made up of multiple piece wiring boards and a frame having accommodation holes to accommodate those piece wiring boards. The entire contents of this publication are incorporated herein by reference.

SUMMARY OF THE INVENTION

According to one aspect of the present invention, a method for manufacturing a combined wiring board includes preparing wiring boards, preparing a metal frame having opening portions formed to accommodate the wiring boards, respectively, positioning the wiring boards in the opening portions in the metal frame, and forming crimped portions in the metal frame by plastic deformation such that sidewalls of the metal frame in the opening portions bond sidewalls of each of the wiring boards. The crimped portions are formed such that the crimped portions in the metal frame have amounts of the plastic deformation which are set different for positions of the crimped portions in the metal frame.

According to another aspect of the present invention, a combined wiring board includes a metal frame having opening portions, and wiring boards accommodated in the opening portions, respectively. The metal frame has crimped portions having plastic deformation such that sidewalls of the metal frame in the opening portions are bonded to sidewalls of each of the wiring boards, and the crimped portions in the metal frame have amounts of the plastic deformation which are different for positions of the crimped portions in the metal frame.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 5 is a plan view of crimp-processed printed wiring boards;
FIG. 7(A)-7(B) are cross-sectional views of a combined wiring board;
FIG. 8(A)-8(B) are cross-sectional views of a crimping machine according to a first embodiment;
FIG. 9 is a plan view of a printed wiring board cut out from the combined wiring board;
FIG. 12(A)-12(B) are cross-sectional views of a crimping machine according to a second embodiment.

DETAILED DESCRIPTION OF THE EMBODIMENTS

Figure 1:
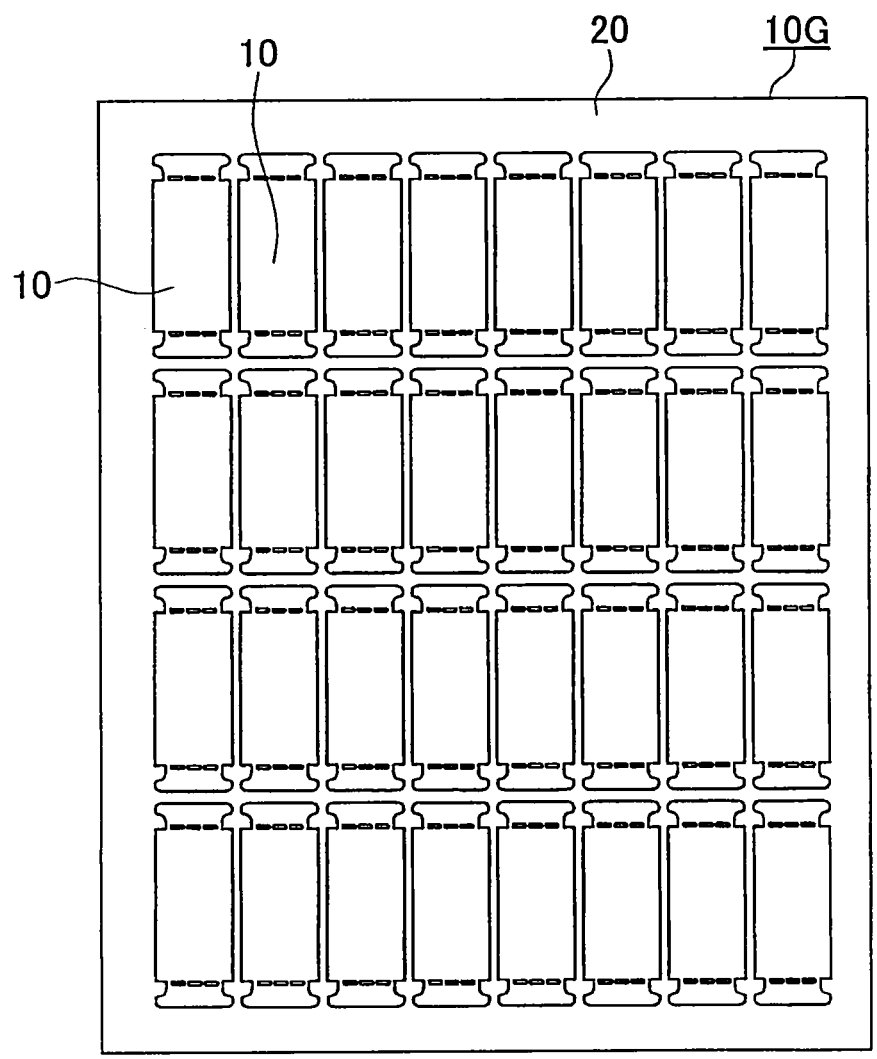
FIG. 1 is a plan view of a multipiece printed wiring board.

The embodiments will now be described with reference to the accompanying drawings, wherein like reference numerals designate corresponding or identical elements throughout the various drawings.

First Embodiment

Figure 10:
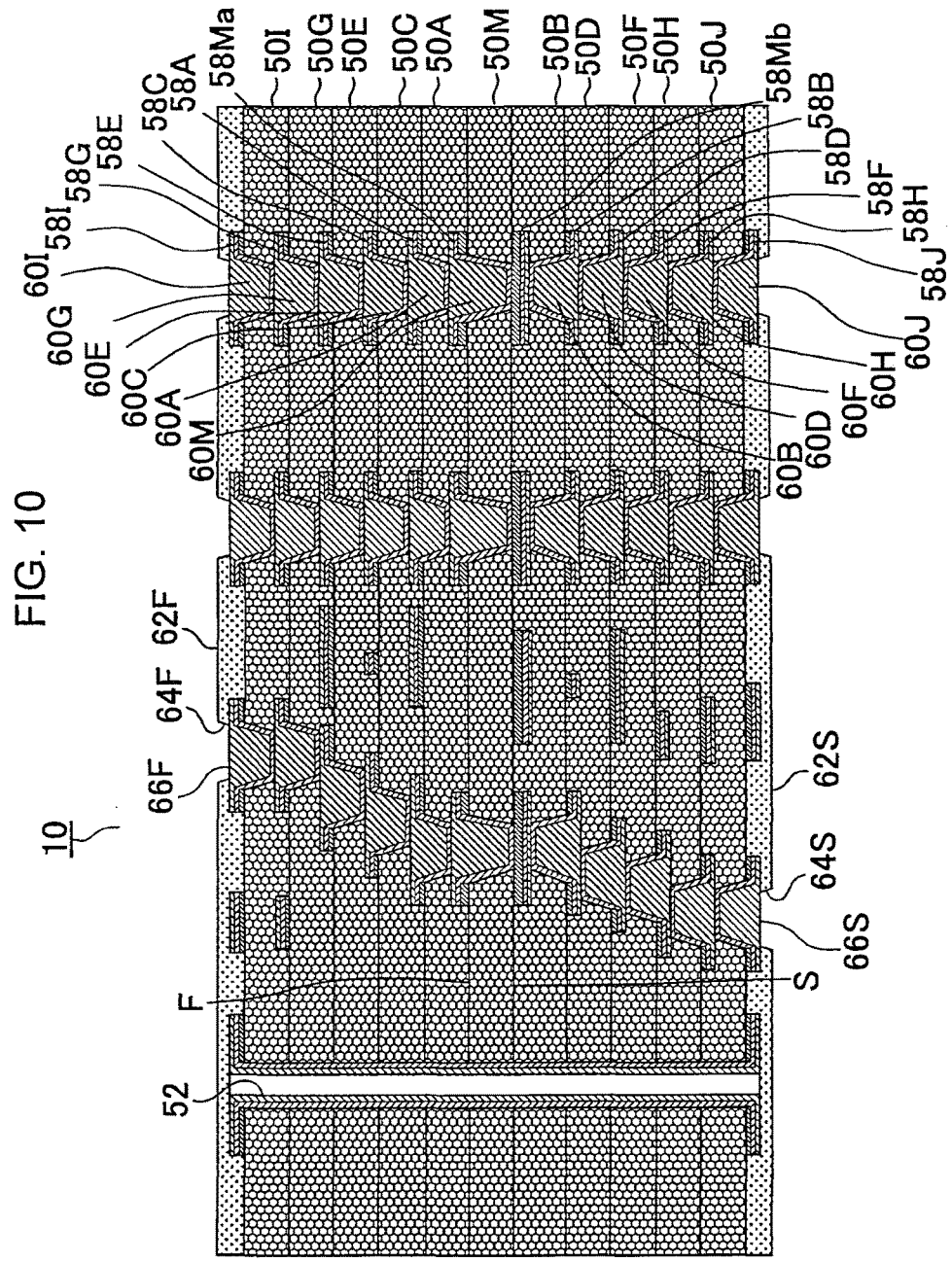
FIG. 10 is a cross-sectional view of a printed wiring board according to the first embodiment.

FIG. 10 is a cross-sectional view of a printed wiring board according to a first embodiment before an electronic component is mounted thereon. In printed wiring board 10, interlayer insulation layers (50A, 50C, 50E, 50G, 50I) are laminated on the first-surface (F) side of core insulation layer (50M) positioned in the center, and interlayer insulation layers (50B, 50D, 50F, 50H, 50J) are laminated on the second-surface (S) side. Conductive circuit (58Ma) on first surface (F) of core insulation layer (50M) and conductive circuit (58Mb) on second surface (S) are connected by via conductor (60M).

In interlayer insulation layer (50A) laminated on the first-surface (F) side of core insulation layer (50M), via conductor (60A) is formed to connect conductive circuit (58A) on interlayer insulation layer (50A) to conductive circuit (58Ma) on core insulation layer (50M). In interlayer insulation layer (50C) laminated on interlayer insulation layer (50A), via conductor (60C) is formed to connect conductive circuit (58C) on interlayer insulation layer (50C) to conductive circuit (58A) on interlayer insulation layer (50A). In interlayer insulation layer (50E) laminated on interlayer insulation layer (50C), via conductor (60E) is formed to connect conductive circuit (58E) on interlayer insulation layer (50E) to conductive circuit (58C) on interlayer insulation layer (50C). In interlayer insulation layer (50G) laminated on interlayer insulation layer (50E), via conductor (60G) is formed to connect conductive circuit (58G) on interlayer insulation layer (50G) to conductive circuit (58E) on interlayer insulation layer (50E). In interlayer insulation layer (50I) laminated on interlayer insulation layer (50G), via conductor (60I) is formed to connect conductive circuit (58I) on interlayer insulation layer (50I) to conductive circuit (58G) on interlayer insulation layer (50G). Solder-resist layer (62F) is formed on interlayer insulation layer (50I), and conductive circuit (58I) exposed in opening (64F) of the solder-resist layer works as pad (66F).

In interlayer insulation layer (50B) laminated on the second-surface (S) side of core insulation layer (50M), via conductor (60B) is formed to connect conductive circuit (58B) on interlayer insulation layer (50B) to conductive circuit (58Mb) on core insulation layer (50M). In interlayer insulation layer (50D) laminated on interlayer insulation layer (50B), via conductor (60D) is formed to connect conductive circuit (58D) on interlayer insulation layer (50D) to conductive circuit (58B) on interlayer insulation layer (50B). In interlayer insulation layer (50F) laminated on interlayer insulation layer (50D), via conductor (60F) is formed to connect conductive circuit (58F) on interlayer insulation layer (50F) to conductive circuit (58D) on interlayer insulation layer (50D). In interlayer insulation layer (50H) laminated on interlayer insulation layer (50F), via conductor (60H) is formed to connect conductive circuit (58H) on interlayer insulation layer (50H) to conductive circuit (58F) on interlayer insulation layer (50F). In interlayer insulation layer (50J) laminated on interlayer insulation layer (50H), via conductor (60J) is formed to connect conductive circuit (58J) on interlayer insulation layer (50J) to conductive circuit (58H) on interlayer insulation layer (50H). Solder-resist layer (62S) is formed on interlayer insulation layer (50J), and conductive circuit (58J) exposed in opening (64S) of the solder-resist layer works as pad (66S). Through hole 52 is formed penetrating through interlayer insulation layers (50I, 50G, 50E, 50C, 50A, 50M, 50B, 50D, 50F, 50H, 50J).

Figure 11:
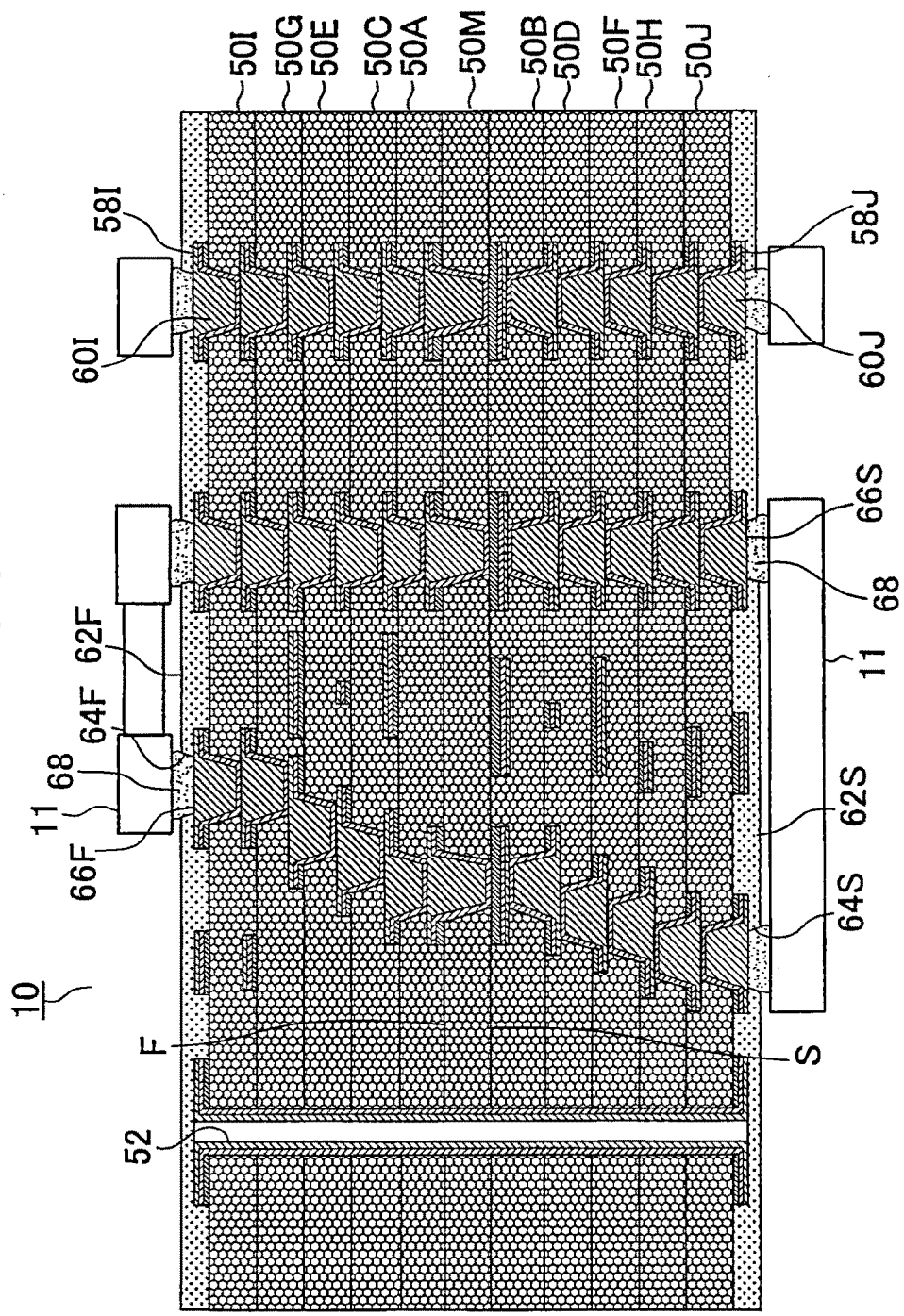
FIG. 11 is a cross-sectional view of a printed wiring board with mounted electronic components according to the first embodiment.

FIG. 11 is a cross-sectional view of a printed wiring board with mounted electronic components. On the first-surface (F) side of the printed wiring board, electronic component 11 is mounted through solder 68 provided on pad (66F), and on the second-surface (S) side, electronic component 11 is mounted through solder 68 provided on pad (66S).

Figure 2:
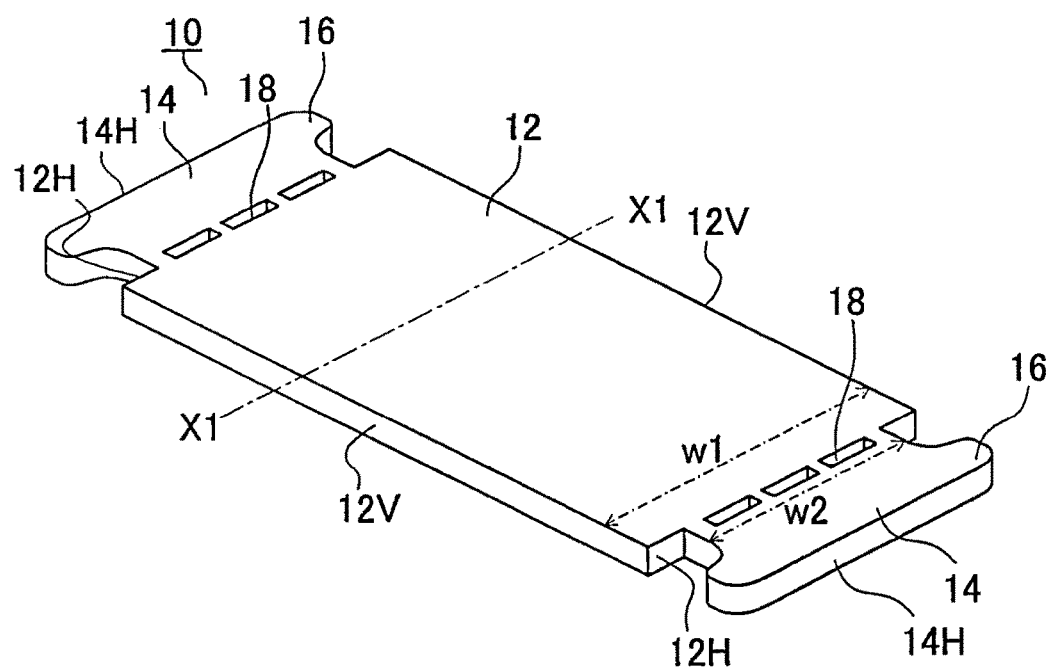
FIG. 2 is a perspective view of a printed wiring board cut out as an individual piece.

FIG. 1 is a plan view of multipiece printed wiring board (10G) where 8×4 printed wiring boards 10 are manufactured. FIG. 2 is a perspective view of printed wiring board 10 cut out into an individual piece. FIG. 10 shows part of the cross section taken at (X1-X1) in FIG. 2. As shown in FIG. 1, printed wiring boards 10 are manufactured inside frame 20 positioned along the periphery of multipiece printed wiring board (10G). As shown in FIG. 2, printed wiring board 10 has rectangular main body 12 structured to have short-side sidewalls (12H) and long-side sidewalls (12V). To each of short-side sidewalls (12H) on both sides of the main body, extension piece 14 is attached, extending in a direction along long-side sidewall (12V) of the main body. Extension pieces (14, 14) are formed to face each other by sandwiching the main body, and are each formed to have end wall (edge side) (14H) that is parallel to short-side sidewall (12H) of main body 12. Width (w2) of extension piece 14 is narrower than width (w1) of main body 12, and slits 18 for cutting off the main body are formed between extension piece 14 and main body 12 along short-side sidewall (12H). In each extension piece 14, a pair of U-shaped protruding pieces 16 is formed to protrude in a direction perpendicular to the direction in which the extension piece extends.

Figure 3A:
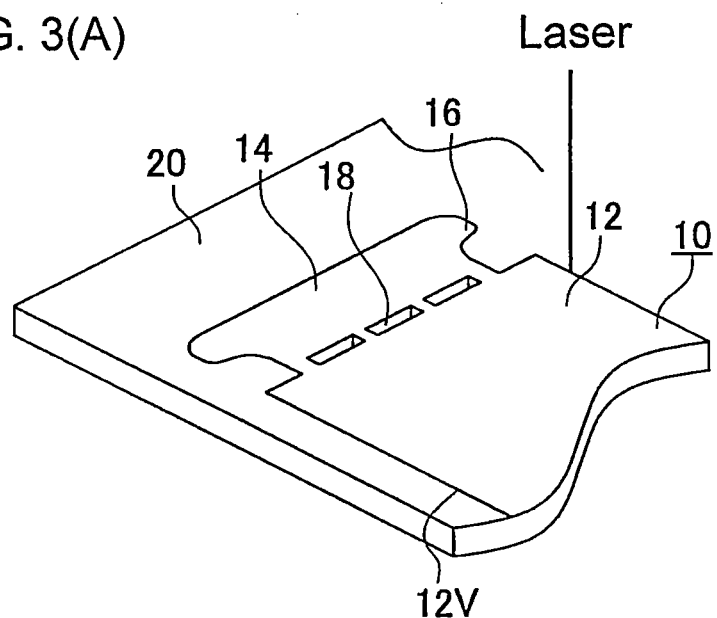
FIG. 3(A)-3(B) are perspective views of a printed wiring board under laser processing.
Figure 3B:
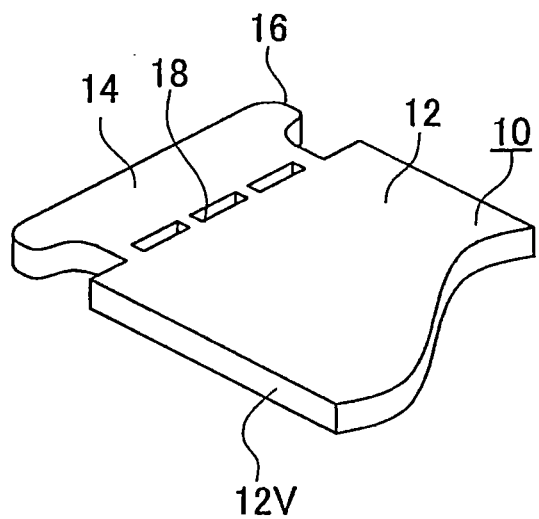

In the first embodiment, when printed wiring board 10 is cut out from multipiece wiring board (10G), a laser is used to cut along the outline of printed wiring board 10 as shown in FIG. 3(A) and an individual piece is cut out as shown in FIG. 3(B). Prior to cutting along the outline of a printed wiring board, slits 18 are formed by a laser.

Figure 4A:
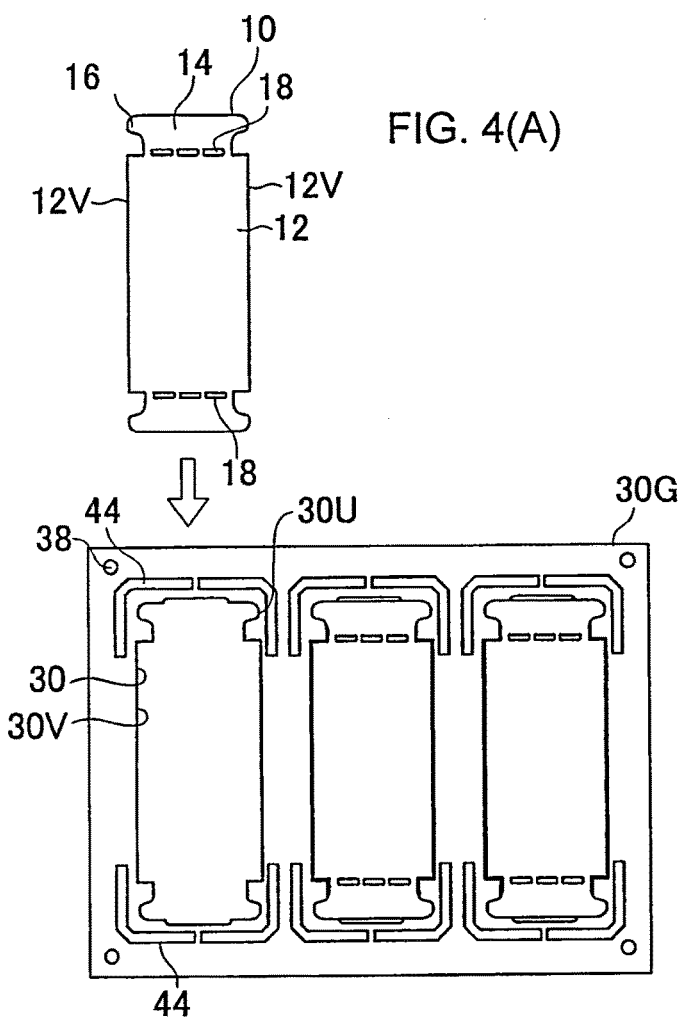
FIG. 4(A) is a plan view of a metal frame, and 4(B) is a plan view of a combined wiring board.

FIG. 4(A) is a plan view of metal frame (30G) made of aluminum. Metal frame (30G) has three accommodation openings 30, each for accommodating a printed wiring board, and alignment holes 38 are formed at the four corners of the frame. On the periphery of opening 30, L-shaped slits 44 are formed to adjust stress.

Figure 4B:
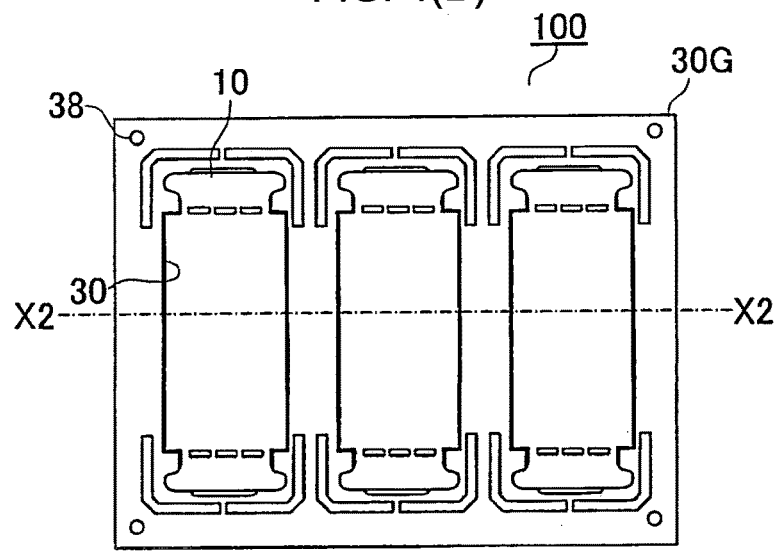

FIG. 4(B) shows a state where printed wiring boards 10 are fixed into all the accommodation openings 30 of metal frame (30G). FIG. 7(A) shows a cross-sectional view of printed wiring board 10 taken at (X2-X2) in FIG. 4(B). Metal frame (30G) is set to have a thickness (t1) of 750 μm, and printed wiring board 10 is set to have a thickness (t2) of 780 μm. Namely, the thickness of the metal frame is less than that of a printed wiring board. In addition, center surface (C1) of metal frame (30G) in a thickness direction corresponds to center surface (C2) of printed wiring board 10 in the thickness direction. Therefore, metal frame (30G) is recessed from upper surface (first surface) (F) of a printed wiring board 10, and metal frame (30G) is recessed from lower surface (second surface) (S) of the printed wiring board. The thermal expansion coefficient along a main surface of metal frame (30G) made of aluminum is 23 ppm/° C., and the thermal expansion coefficient along a main surface of printed wiring board 10 made of resin is 16 ppm/° C. The thermal expansion coefficient of metal frame (30G) is higher than that of the printed wiring board. The thickness of the metal frame is set to be less than that of a printed wiring board so that a difference in thermal expansion coefficients will not cause warping in the printed wiring board. In addition, a printed wiring board is fixed to the frame in such a way that metal frame (30G) is recessed from upper surface (first surface) (F) of printed wiring board 10 and metal frame (30G) is recessed from lower surface (second surface) (S) of printed wiring board 10. Accordingly, when electronic components are mounted on printed wiring boards, metal frame (30G) will not interfere with the mounting procedure. Aluminum is used as the material for the metal frame in the first embodiment, but copper or stainless steel may also be used as long as its thermal expansion coefficient is higher than that of printed wiring boards.

FIG. 5 shows a state where printed wiring board 10 is fixed to accommodation opening 30 of metal frame (30G). Accommodation opening 30 has long-side sidewall (30V) facing long-side sidewall (12V) of main body 12, short-side sidewall (30H) facing short-side sidewall (12H) of main body 12, extension-direction sidewall (30Vv) facing extension-direction sidewall (14V) of extension piece 14, recessed portion (30D) facing edge wall (14H) of extension piece 14, and U-shaped portion (30U) abutting protruding piece 16. A predetermined clearance is provided between long-side sidewall (12V) of main body 12 and long-side sidewall (30V), between short-side sidewall (12H) of main body 12 and short-side sidewall (30H), and between extension-direction sidewall (14V) of extension piece 14 and extension-direction sidewall (30Vv). Since printed wiring board 10 is longer in a long-side direction, its expansion is greater in the long-side direction. Thus, a greater space is provided between edge wall (14H) of extension piece 14 and recessed portion (30D) so that interference is prevented between opening 30 and edge wall (14H). Accordingly, stress on edge wall (14H) is suppressed when the printed wiring board undergoes thermal contraction.

First crimped portion (36a) is formed at the base of U-shaped portion (30U) of opening 30 and at the border between U-shaped portion (30U) and recessed portion (30D). Second crimped portion (36b) is formed at the border of U-shaped portion (30U) and extension-direction sidewall (30Vv). Because of first crimped portion (36a) and second crimped portion (36b), the sidewall of U-shaped portion (30U) is in contact with, and is pressed against, the sidewall of protruding piece 16. Distance (d1) from central point (CP) of substrate 10 to first crimped portion (36a) is longer than distance (d2) from central point (CP) to second crimped portion (36b). Here, the amount of deformation exerted on second crimped portion (36b) is greater than the amount of deformation exerted on first crimped portion (36a). By exerting a greater amount of deformation on second crimped portion (36b) closer to central point (CP), outward stress is designed to be exerted on substrate 10.

FIG. 8(A) is a cross-sectional view of crimping machine 300 to conduct a crimping process on a printed wiring board. Crimping machine 300 has lower die 210 and upper die 310. Lower die 210 has base portion 211 and support plate 218. Support plate 218 is supported to be vertically movable with respect to base portion 211. Punches (216a, 216b) for crimping are provided to base portion 211, and penetrating holes (218h) for punches (216a, 216b) to pass through are formed in support plate 218. In the central portion of support plate 218, recessed portion (218d) is formed so as not to exert force on a printed wiring board during crimping. Printed wiring board 10 is placed on recessed portion (218d), and metal frame (30G) is placed on support plate 218.

Upper die 310 has base portion 311 and support plate 318. Support plate 318 is supported to be vertically movable with respect to base portion 311. Punches (316a, 316b) for crimping are formed in base portion 311, and penetrating holes (318b) for punches (316a, 316b) to pass through are formed in support plate 318. Recessed portion (318d) is formed in the central portion of support plate 318. Punches (216a, 316a) are for forming first crimped portions (36a), and punches (216b, 316b) are for forming second crimped portions (36b). The tips of punches (216b, 316b) respectively protrude more than the tips of punches (216a, 316a) by (f1) (0.5 mm). Thus, the tips of punches (216b, 316b) are inserted into metal frame (30G) deeper than the tips of punches (216a, 316a). Therefore, the amount of deformation caused by crimping using punches (216b, 316b) is greater than the amount of deformation caused by punches (216a, 316a). The amount of deformation caused by punches (216b, 316b) at the sidewall of an opening of the metal frame is 75 μm. The amount of deformation caused by punches (216a, 316a) at the sidewall of the opening of the metal frame is 35 μm. The amount of deformation caused by crimping using punches (216b, 316b) is preferred to be 1.2~3 times the amount of deformation caused by crimping using punches (216a, 316a). If it is less than 1.2 times, stress on the substrate cannot be adjusted. On the other hand, if it exceeds 3 times, the amount of deformation will be overly greater than the other, resulting in excessive stress on the wiring board.

FIG. 8(B) is a view showing a state where upper die 310 is pressed against lower die 210, punches (316a, 316b) of upper die 310 are pressed against the upper surface of metal frame (30G), and punches (216a, 216b) of lower die 210 are pressed against the lower surface of metal frame (30G). In each of three accommodation openings 30 of metal frame (30G) shown in FIG. 4(B), crimped portions (36a, 36b) are formed simultaneously as shown in FIG. 5. Accordingly, combined wiring board 100 made up of printed wiring boards 10 and metal frame (30G) is completed, ready for a reflow process.

In a combined wiring board of the first embodiment, crimped portions (36a, 36b) are formed simultaneously in each of three accommodation openings 30. Thus, printed wiring boards are accurately aligned with metal frame (30G). Here, compared with a combined wiring board where an adhesive agent or the like is used for fixing printed wiring boards to the frame, crimping is conducted simultaneously on all the printed wiring boards. Thus, alignment with metal frame (30G) is accurate, and positional shifting among printed wiring boards is minimized. Moreover, compared with an alignment method using an adhesive agent, since the steps for filling and curing the adhesive agent are not required, there are fewer manufacturing steps. Thus, productivity is enhanced and the manufacturing cost of fixing printed wiring boards to a metal frame is reduced.

Figure 6:
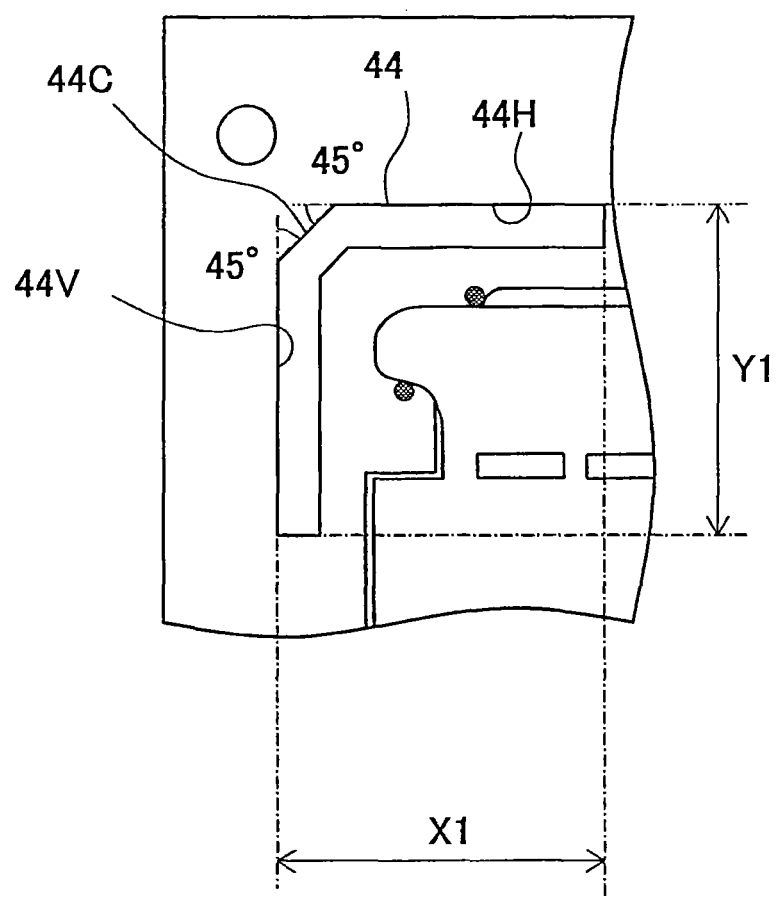
FIG. 6 is an enlarged view of an L-shaped slit in FIG. 5.

FIG. 6 is an enlarged view of L-shaped slit 44. L-shaped slit 44 has first straight portion (44H) formed in a long-side direction of metal frame (30G), second straight portion (44V) formed in a short-side direction of metal frame (30G) to be perpendicular to the first straight portion, and third straight portion (44C) positioned between the first straight portion and the second straight portion. The angle made by an extension line of first straight portion (44H) and third straight portion (44C) is approximately 45 degrees, and the angle made by an extension line of second straight portion (44V) and third straight portion (44C) is approximately 45 degrees. Length (X1) (length of L-shaped slit in a direction of X) obtained by adding the length of first straight portion (44H) and the length of a component of third straight portion (44C) extended in a direction along the first straight portion is 18 mm. Length (Y1) (length of L-shaped slit in a direction of Y) obtained by adding the length of second straight portion (44V) and the length of a component of third straight portion (44C) extended in a direction along the second straight portion is 18 mm. The length of first straight portion (44H) is equal to the length of second straight portion (44V).

Extension piece 14 of printed wiring board 10 according to the first embodiment is structured to have a pair of protruding pieces 16 in substantially a U-shape with a width increasing toward both of its sides, and crimped portions (36a, 36b) are formed on each base portion of protruding pieces 16. Because of crimped portions (36a, 36b), the sidewall of U-shaped portion (30U) is in contact with, and is pressed against, the sidewall of protruding piece 16. In the portions of protruding piece 16 except for those fixed by crimped portions (36a, 36b), the sidewall of a printed wiring board is not in contact with the sidewall of an accommodation opening. There is a clearance between long-side sidewall (14V) of main body 20 and accommodation opening 30. On crimped portion (36a) formed at the edge of end wall (14H) of extension piece 14, stress is exerted in a long-side direction of a printed wiring board, but L-shaped slit 44 is formed on the line extended in a long-side direction of the printed wiring board from which stress is exerted. Meanwhile, on each of crimped portions (36a, 36b), stress is exerted in a short-side direction of the printed wiring board, but L-shaped slit 44 is formed on the line extended in a short-side direction of the printed wiring board from which stress is exerted. Accordingly, stress is mitigated uniformly in the printed wiring board during a reflow process, and thus the printed wiring board is unlikely to warp.

In the first embodiment, at a temperature for solder reflow, the frame section made of metal frame (30G) is preferred to have a rigidity higher than that of piece sections made of printed wiring boards 10 and so on.

In a state where each printed wiring board 10 is fixed to accommodation opening 30 of metal frame (30G) shown in FIG. 5, solder printing is conducted, and electronic components are positioned and mounted in a reflow oven. Since the reflow temperature reaching almost 200° C. exceeds the Tg (glass-transition temperature) of the resin in the printed wiring boards, warping tends to occur in the printed wiring boards due to the weights of mounted electronic components and the stress remaining in the boards. In the first embodiment, as shown in FIG. 7(B), in printed wiring board 10 fixed to metal frame (30G), stress toward the center of printed wiring board 10 is generated along with stress from the weight of electronic component 11. However, since the thermal expansion coefficient along a main surface of metal frame (30G) is greater than that of printed wiring board 10 as described above, expansion of metal frame (30G) in a planar direction is greater than that of printed wiring board 10. Thus, on printed wiring board 10 fixed into accommodation opening 30, stress (F1) toward the periphery is exerted so as to cancel out the stress toward the center of printed wiring board 10. Accordingly, warping is unlikely to occur in the printed wiring board during the reflow process.

As described above, the amount of deformation exerted on second crimped portion (36b) is greater than the amount of deformation exerted on first crimped portion (36a). By exerting a greater amount of deformation to second crimped portion (36b) closer to central point (CP), outward stress is designed to be exerted on wiring board 10. Accordingly, stress is exerted on a wiring board in a direction opposite the stress caused by thermal contraction generated during a reflow process. As a result, warping is prevented in the wiring board during the reflow process.

As shown in FIG. 5, extension piece 14 is formed at short-side sidewall (14H) on each side of rectangular main body 20 of printed wiring board 10, and those extension pieces face each other by sandwiching main body 20. Main body 20 and extension piece 14 are connected by bridge portion 19 made of slits 18.

FIG. 9(A) shows metal frame (30G) after bridge portion 19 between slits 18 is cut and main body 20 of a printed wiring board shown in FIG. 9(B) is separated. Extension piece 14 of the printed wiring board remains on metal frame (30G). In the first embodiment, since slits 18 are formed in advance, it is easier to separate main body 20 of a printed wiring board.

Second Embodiment

FIG. 12(A) is a cross-sectional view of crimping machine 300 to conduct a crimping process on a printed wiring board in a second embodiment. FIG. 12(B) shows a state where upper die 310 is pressed against lower die 210, punches (316a, 316b) of upper die 310 are pressed against the upper surface of metal frame (30G), and punches (216a, 216b) of lower die 210 are pressed against the lower surface of metal frame (30G). The same as in the first embodiment, punches (216a, 316a) are for forming first crimped portions (36a) and punches (216b, 316b) are for forming second crimped portions (36b) in the second embodiment. Punches (216a, 316a) each have the same length as punches (216b, 316b), but punches (216a, 316a) are each set to have diameter (d1) (5 mm), whereas punches (216b, 316b) are each set to have diameter (d2) (6 mm). Therefore, the amount of deformation caused by crimping using larger-diameter punches (216b, 316b) is greater than the amount of deformation caused by crimping using smaller-diameter punches (216a, 316a). The amount of deformation caused by crimping using punches (216b, 316b) is preferred to be 1.2~3 times the amount of deformation caused by crimping using punches (216a, 316a). If it is less than 1.2 times, stress on the substrate cannot be adjusted. On the other hand, if it exceeds 3 times, the amount of deformation will be overly greater than the other, resulting in excessive stress on the wiring board.

The length of punches is set to be different in the first embodiment, and the width of punches is set to be different in the second embodiment. Instead, the amount of deformation caused by crimping may also be changed by modifying the distance from the crimped portion to the sidewall of an opening or by changing the number of crimped portions to be positioned.

In a multipiece wiring board accommodation kit, an adhesive agent may be injected at a connection portion of a piece wiring board and an accommodation hole of a frame, an adhesive agent capable of adhering different materials to each other may be required. Also, steps additionally required for filling and curing the adhesive agent decrease productivity. Moreover, since each wiring board is individually fixed into an accommodation hole, significant positional shifting may be caused between wiring boards and lower yield is thought to result in later procedures. Yet moreover, piece wiring boards are likely to warp from the stress generated during a reflow process. Thus, yield in the reflow process is thought to be low.

A combined wiring board according to an embodiment of the present invention and a method for manufacturing such a combined wiring board according to an embodiment of the present invention exhibit high productivity.

A method for manufacturing a combined wiring board according to an embodiment of the present invention includes preparing wiring boards, preparing a metal frame having openings to accommodate the wiring boards, positioning wiring boards in openings of the metal frame, and bonding sidewalls of the wiring boards and sidewalls of the openings of the metal frame by causing plastic deformation in multiple portions of the metal frame. Such a manufacturing method is characterized in that the amount of plastic deformation is set different depending on those portions.

In the method for manufacturing a combined wiring board according to the embodiment, wiring boards are fixed to a metal frame by causing plastic deformation in the metal frame. Thus, unlike a method using an adhesive agent, steps for filling and curing the adhesive agent are not required, and the number of processing steps is smaller. Accordingly, productivity is enhanced and the manufacturing cost of fixing wiring boards to a metal frame is reduced. Compared with a method where multiple wiring boards are fixed in their respective openings using an adhesive agent, since a plastic deformation process is conducted on multiple wiring boards at the same time, accurate alignment with the metal frame is achieved for all the wiring boards, while positional shifting among wiring boards is minimized. Then, by setting a different amount of plastic deformation depending on the portions, stress is exerted on a wiring board in a direction opposite the stress generated during the reflow process. Accordingly, warping is prevented in the wiring board during the reflow process.

Obviously, numerous modifications and variations of the present invention are possible in light of the above teachings. It is therefore to be understood that within the scope of the appended claims, the invention may be practiced otherwise than as specifically described herein.

What is claimed is:

1. A method for manufacturing a combined wiring board, comprising:
   preparing a plurality of wiring boards;

preparing a metal frame having a plurality of opening portions configured to accommodate the plurality of wiring boards, respectively;

positioning the plurality of wiring boards in the plurality of opening portions in the metal frame; and forming a plurality of crimped portions in the metal frame by plastic deformation such that sidewalls of the metal frame in the opening portions bond sidewalls of each of the wiring boards, wherein:

the plurality of crimped portions is formed such that the crimped portions in the metal frame have amounts of the plastic deformation which are set different for positions of the crimped portions in the metal frame; and the plurality of crimped portions in the metal frame is positioned such that each of the wiring boards has a plurality of corners each of which is interposed between two crimped portions of the plurality of crimped portions in the metal frame, and the amounts of the plastic deformation are set different for the crimped portions in the metal frame such that one of the two crimped portions at each corner of a wiring board is positioned closer to the center of the wiring board and has a larger amount of the plastic deformation with respect to the other one of the two crimped portions.

2. A method for manufacturing a combined wiring board according to claim 1, wherein the amounts of the plastic deformation are determined by deformation amounts at the sidewalls of the metal frame.

3. A method for manufacturing a combined wiring board according to claim 1, wherein the forming of the crimped portions comprises applying press to the positions of the crimped portions in the metal frame with upper pillar devices and lower pillar devices, and the applying of press includes applying deep press for the one of the two crimped portions positioned closer to the center of the wiring board and applying shallow press for the other one of the two crimped portions.

4. A method for manufacturing a combined wiring board according to claim 1, wherein the forming of the crimped portions comprises applying press to the positions of the crimped portions in the metal frame with upper pillar devices and lower pillar devices, and the applying of press includes applying press for the one of the two crimped portions positioned closer to the center of the wiring board with the upper pillar devices having a large diameter and the lower pillar devices having a large diameter and applying press for the other one of the two crimped portions with the upper pillar devices having a small diameter and the lower pillar devices having a small diameter.

5. A method for manufacturing a combined wiring board according to claim 1, wherein the two crimped portions at each corner of the wiring board are formed simultaneously.

6. A method for manufacturing a combined wiring board according to claim 1, wherein the plurality of crimped portions in the metal frame is simultaneously formed by the plastic deformation such that the sidewalls of the metal frame in the opening portions simultaneously bond the sidewalls of each of the wiring boards.

7. A method for manufacturing a combined wiring board according to claim 1, wherein the forming of the crimped portions comprises applying press to the positions of the crimped portions in the metal frame with upper punch devices and lower punch devices, and the applying of press includes applying deep press for the one of the two crimped portions positioned closer to the center of the wiring board and applying shallow press for the other one of the two crimped portions.

8. A method for manufacturing a combined wiring board according to claim 1, wherein the forming of the crimped portions comprises applying press to the positions of the crimped portions in the metal frame with upper punch devices and lower punch devices, and the applying of press includes applying press for the one of the two crimped portions positioned closer to the center of the wiring board with the upper punch devices having a large diameter and the lower punch devices having a large diameter and applying press for the other one of the two crimped portions with the upper punch devices having a small diameter and the lower punch devices having a small diameter.

9. A combined wiring board, comprising:

a metal frame having a plurality of opening portions; and a plurality of wiring boards accommodated in the plurality of opening portions, respectively, wherein:

the metal frame has a plurality of crimped portions having plastic deformation such that sidewalls of the metal frame in the opening portions are bonded to sidewalls of each of the wiring boards, and the plurality of crimped portions in the metal frame have amounts of the plastic deformation which are different for positions of the crimped portions in the metal frame; and the plurality of crimped portions in the metal frame is positioned such that each of the wiring boards has a plurality of corners each of which is interposed between two crimped portions of the plurality of crimped portions in the metal frame, and one of the two crimped portions at each corner of a wiring board is positioned closer to the center of the wiring board and has a larger amount of the plastic deformation with respect to the other one of the two crimped portions.

10. A combined wiring board according to claim 9, wherein the amounts of the plastic deformation are determined by deformation amounts at the sidewalls of the metal frame.

11. A combined wiring board according to claim 9, wherein the one of the two crimped portions positioned closer to the center of the wiring board is formed deeper with respect to the other one of the two crimped portions.

12. A combined wiring board according to claim 9, wherein the one of the two crimped portions positioned closer to the center of the wiring board is formed to have a larger diameter with respect to a diameter of the other one of the two crimped portions.

13. A combined wiring board according to claim 9, wherein the plurality of wiring boards has a plurality of extension portions, respectively.

14. A combined wiring board according to claim 13, wherein the plurality of crimped portions in the metal frame is positioned such that the sidewalls of the metal frame in the opening portions are bonded to the sidewalls of the wiring boards in the extension portions.

15. A combined wiring board according to claim 14, wherein the extension portions of the wiring boards have a plurality of corners each of which is interposed between two crimped portions of the plurality of crimped portions in the metal frame.

16. A combined wiring board according to claim 9, wherein the metal frame has a coefficient of thermal expansion which is greater than a coefficient of thermal expansion of the wiring boards.

* * * * *